United States Patent
Yang

(10) Patent No.: US 10,469,785 B1
(45) Date of Patent: Nov. 5, 2019

(54) CABLE TELEVISION SYSTEM WITH PRINTED-CIRCUIT-BOARD-LAYOUT COMPONENTS

(71) Applicant: CABLE VISION ELECTRONICS CO., LTD, New Taipei (TW)

(72) Inventor: Chiang-Po Yang, New Taipei (TW)

(73) Assignee: CABLE VISION ELECTRONICS CO., LTD, New Taipei (TW)

( * ) Notice: Subject to any disclaimer, the term of this patent is extended or adjusted under 35 U.S.C. 154(b) by 0 days.

(21) Appl. No.: 16/362,593

(22) Filed: Mar. 22, 2019

(30) Foreign Application Priority Data

Feb. 20, 2019 (TW) .............................. 108202146 U

(51) Int. Cl.
*H04N 5/44* (2011.01)
*H04N 7/10* (2006.01)
*H05K 1/18* (2006.01)

(52) U.S. Cl.
CPC .......... *H04N 5/4401* (2013.01); *H04N 7/102* (2013.01); *H05K 1/182* (2013.01); *H05K 2201/1006* (2013.01); *H05K 2201/10015* (2013.01); *H05K 2201/10022* (2013.01)

(58) Field of Classification Search
CPC ....... H04N 5/4401; H04N 7/102; H05K 1/182
USPC ....... 348/725, 726, 731, 732, 733, 735, 737; 725/121, 131, 133, 143, 151; 455/315, 455/339
See application file for complete search history.

(56) References Cited

U.S. PATENT DOCUMENTS

| | | | | |
|---|---|---|---|---|
| 5,572,264 A * | 11/1996 | Mizukami | ............ | H04N 5/4401 348/735 |
| 5,737,035 A * | 4/1998 | Rotzoll | ................. | H03D 7/161 348/725 |
| 6,177,964 B1 * | 1/2001 | Birleson | ................ | H03D 7/161 348/725 |
| 6,550,063 B1 * | 4/2003 | Matsuura | ............... | H04N 7/104 348/725 |
| 6,725,463 B1 * | 4/2004 | Birleson | ............. | H03D 7/1433 331/22 |
| 7,202,910 B1 * | 4/2007 | Grubbs | .................... | H04N 5/50 348/554 |
| 2002/0047942 A1 * | 4/2002 | Vorenkamp | ............ | H04N 5/455 348/731 |
| 2003/0200548 A1 * | 10/2003 | Baran | ............... | H04L 29/06027 725/90 |

(Continued)

*Primary Examiner* — Jefferey F Harold
*Assistant Examiner* — Mustafizur Rahman
(74) *Attorney, Agent, or Firm* — Chun-Ming Shih; HDLS IPR Services

(57) ABSTRACT

A cable television system with printed-circuit-board-layout components receives a cable television signal. The cable television system includes a low pass filter apparatus. The low pass filter apparatus includes a printed circuit board, a plurality of low pass filters and at least one grounded metal wall. Each of the low pass filters includes a low-pass-side inductor and a low-pass-side capacitor. At least two of the low-pass-side inductors of the low pass filters are manufactured on the printed circuit board by a printed-circuit-board-layout technology to form at least two low-pass-side printed-circuit-board-layout inductors. The at least one grounded metal wall blocks a magnetic interference between the low-pass-side inductors of the low pass filters. The low pass filter apparatus filters out a signal having a frequency above 1 GHz.

10 Claims, 3 Drawing Sheets

(56) References Cited

U.S. PATENT DOCUMENTS

| | | | |
|---|---|---|---|
| 2008/0106650 A1* | 5/2008 | Ecoff | H04N 5/455 348/726 |
| 2010/0085490 A1* | 4/2010 | Chen | H04N 5/46 348/725 |
| 2010/0095344 A1* | 4/2010 | Newby | H04L 12/2801 725/125 |

* cited by examiner

CABLE TELEVISION SYSTEM WITH PRINTED-CIRCUIT-BOARD-LAYOUT COMPONENTS

BACKGROUND OF THE INVENTION

Field of the Invention

The present invention relates to a cable television system, and especially relates to a cable television system with printed-circuit-board-layout components.

Description of the Related Art

Currently, the cable television (CATV) system is very popular. The cable television system transmits television programs and network signals to client sides through coaxial cables. The client sides can use multimedia over coax alliance (which is usually abbreviated as MoCA) apparatuses so that a plurality of rooms have the network signals to use at the same time.

The related art cable television system comprises the related art low pass filter apparatus to filter out the multimedia over coax alliance signals, so that the related art low pass filter apparatus is very important. However, the related art inductor of the related art low pass filter apparatus comprises following disadvantages:
1. The magnetic interference between the related art inductors is strong.
2. The related art inductors are dip inductors, so that the cost of the inductors is high.
3. The related art inductors are dip inductors, so that the inductors need larger installation space.

SUMMARY OF THE INVENTION

In order to solve the above-mentioned problems, an object of the present invention is to provide a cable television system with printed-circuit-board-layout components.

In order to achieve the object of the present invention mentioned above, the cable television system of the present invention is configured to receive a cable television signal. The cable television system comprises a low pass filter apparatus. Moreover, the low pass filter apparatus comprises a printed circuit board, a plurality of low pass filters and at least one grounded metal wall. The low pass filters are arranged on the printed circuit board. The at least one grounded metal wall is arranged corresponding to the low pass filters. Moreover, each of the low pass filters comprises a low-pass-side inductor and a low-pass-side capacitor. The low-pass-side inductor is arranged on the printed circuit board. The low-pass-side capacitor is electrically connected to the low-pass-side inductor. The low-pass-side capacitor is arranged on the printed circuit board. Moreover, at least two of the low-pass-side inductors of the low pass filters are manufactured on the printed circuit board by a printed-circuit-board-layout technology to form at least two low-pass-side printed-circuit-board-layout inductors. The at least one grounded metal wall is configured to block a magnetic interference between the low-pass-side inductors of the low pass filters. The low pass filter apparatus is configured to filter out a signal having a frequency above 1 GHz.

Moreover, in the cable television system mentioned above, the at least one grounded metal wall is a part of a metal housing of the low pass filter apparatus. The printed circuit board and the low pass filters are arranged in the metal housing. An average distance between at least one of the low-pass-side printed-circuit-board-layout inductors of the low pass filters and the metal housing is within a first distance range.

Moreover, in the cable television system mentioned above, the first distance range is between 0.1 millimeter and 3 millimeters.

Moreover, in the cable television system mentioned above, the at least one grounded metal wall is arranged on the printed circuit board.

Moreover, in the cable television system mentioned above, at least one of the low-pass-side capacitors of the low pass filters is manufactured on the printed circuit board by the printed-circuit-board-layout technology to form a low-pass-side printed-circuit-board-layout capacitor.

Moreover, in the cable television system mentioned above, each of the low pass filters further comprises a low-pass-side first inductor. The low-pass-side first inductor is electrically connected to the low-pass-side capacitor. The low-pass-side first inductor or the low-pass-side capacitor is connected to ground. The low-pass-side first inductor is arranged on the printed circuit board.

Moreover, in the cable television system mentioned above, the low pass filters are configured to filter out a multimedia over coax alliance signal.

Moreover, in the cable television system mentioned above, the low pass filter apparatus further comprises a resistance-type distribution circuit. The resistance-type distribution circuit is electrically connected to the low pass filters. The resistance-type distribution circuit is arranged on the printed circuit board. Moreover, the resistance-type distribution circuit comprises a connection resistor, a plurality of distribution resistors and a plurality of high pass filters. The connection resistor is electrically connected to the low pass filters. The connection resistor is arranged on the printed circuit board. The distribution resistors are electrically connected to the connection resistor. The distribution resistors are arranged on the printed circuit board. The high pass filters are electrically connected to the distribution resistors. The high pass filters are arranged on the printed circuit board. Moreover, each of the high pass filters is configured to filter out a low frequency signal. Moreover, each of the high pass filters comprises a high-pass-side capacitor and a high-pass-side grounded inductor. The high-pass-side capacitor is electrically connected to one of the distribution resistors. The high-pass-side capacitor is arranged on the printed circuit board. One side of the high-pass-side grounded inductor is electrically connected to the high-pass-side capacitor. The other side of the high-pass-side grounded inductor is connected to ground. The high-pass-side grounded inductor is arranged on the printed circuit board.

Moreover, in the cable television system mentioned above, at least one of the high-pass-side grounded inductors of the high pass filters is manufactured by the printed-circuit-board-layout technology to form a high-pass-side printed-circuit-board-layout grounded inductor.

Moreover, in the cable television system mentioned above, at least one of the low-pass-side first inductors of the low pass filters is manufactured on the printed circuit board by the printed-circuit-board-layout technology to form a low-pass-side printed-circuit-board-layout grounded inductor. At least one of the low-pass-side first inductors of the low pass filters is a low-pass-side dip inductor.

The advantages of the present invention are to reduce the magnetic interference between the inductors, and to save the cost of the inductors and the installation space of the inductors.

Please refer to the detailed descriptions and figures of the present invention mentioned below for further understanding the technology, method and effect of the present invention achieving the predetermined purposes. It believes that the purposes, characteristic and features of the present invention can be understood deeply and specifically. However, the figures are only for references and descriptions, but the present invention is not limited by the figures.

DETAILED DESCRIPTION OF THE INVENTION

Figure 1:
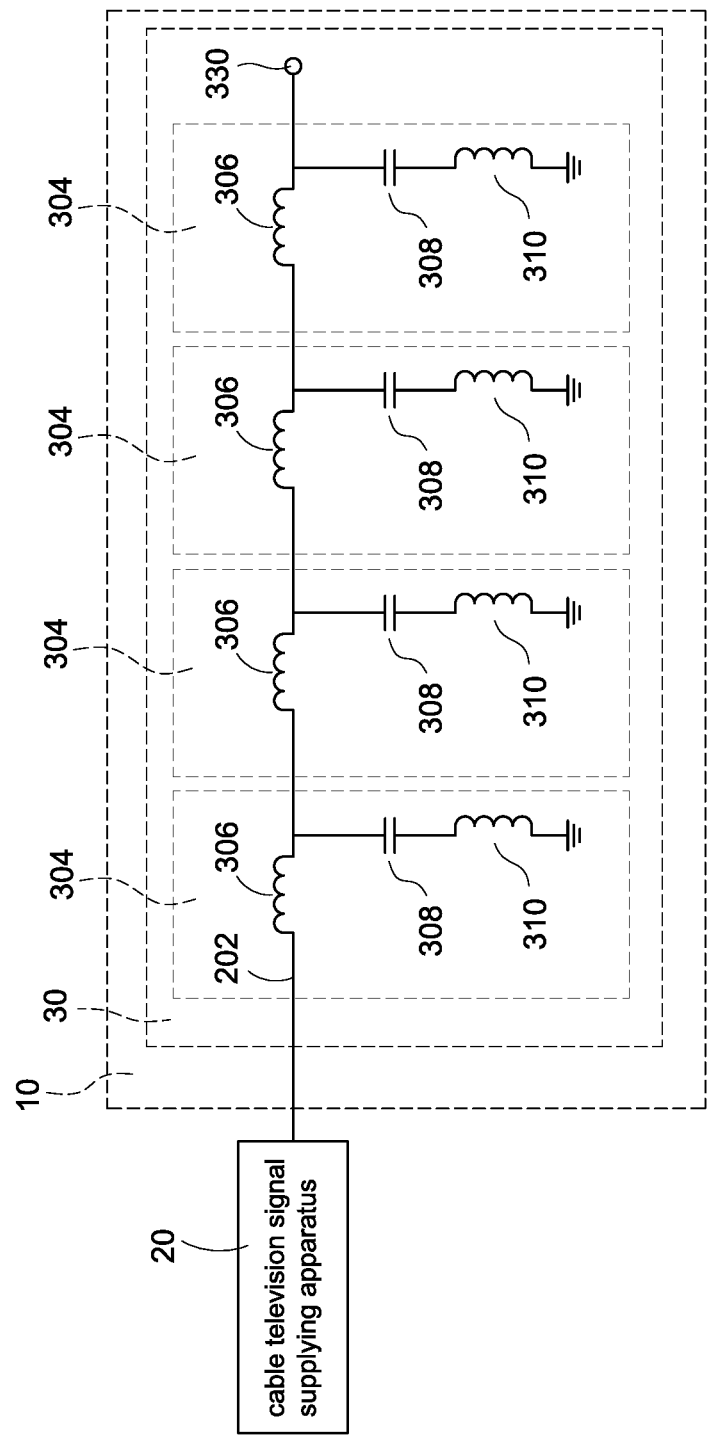
FIG. 1 shows a part of the circuit block diagram of the cable television system of the present invention.
Figure 2:
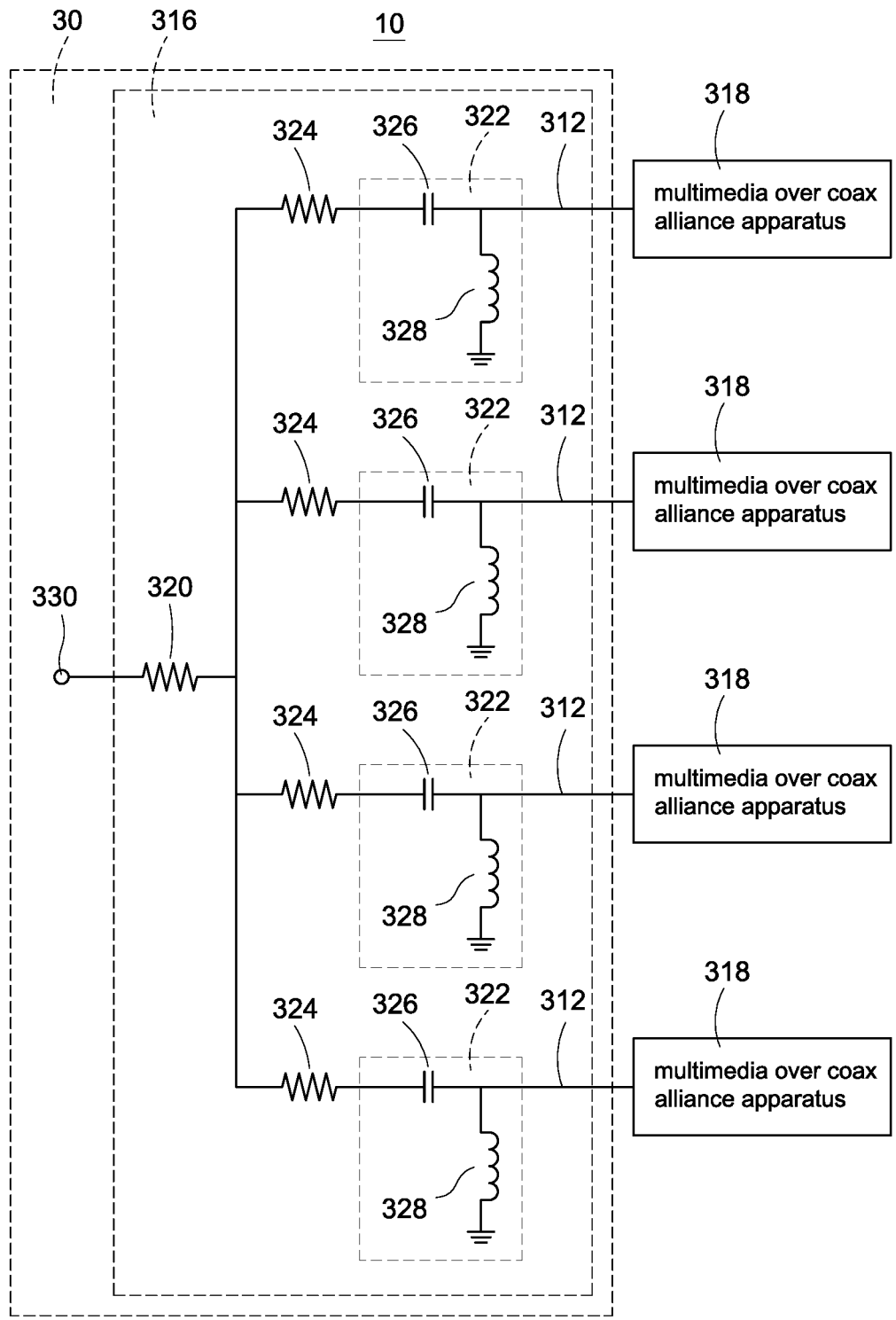
FIG. 2 shows another part of the circuit block diagram of the cable television system of the present invention.
Figure 3:
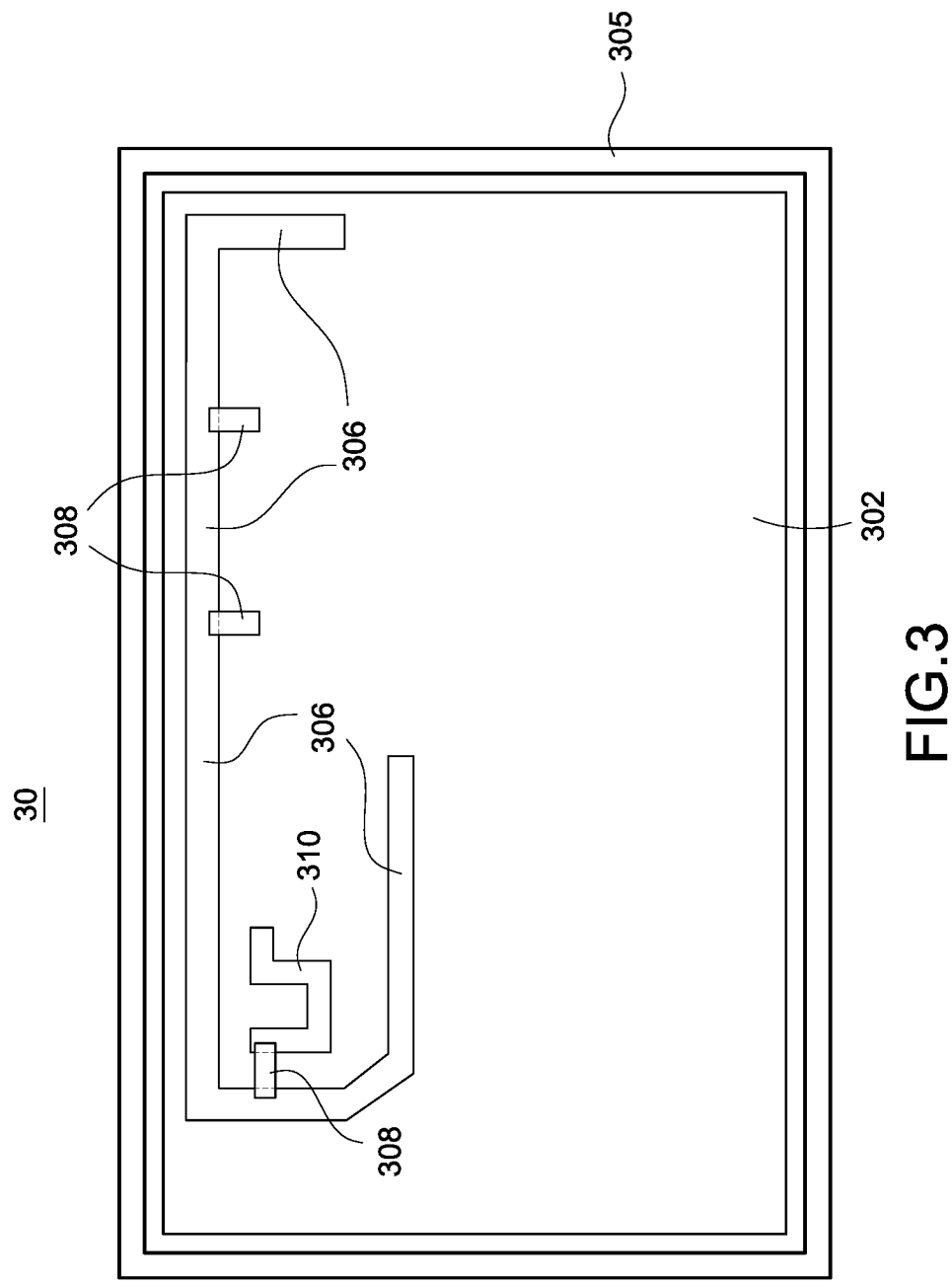
FIG. 3 shows a part of the top view of the low pass filter apparatus of the present invention.

In the present disclosure, numerous specific details are provided, to provide a thorough understanding of embodiments of the invention. Persons of ordinary skill in the art will recognize, however, that the present invention can be practiced without one or more of the specific details. In other instances, well-known details are not shown or described to avoid obscuring aspects of the present invention. Now please refer to the figures for the explanation of the technical content and the detailed description of the present invention:

FIG. 1 shows a part of the circuit block diagram of the cable television system of the present invention. FIG. 2 shows another part of the circuit block diagram of the cable television system of the present invention. FIG. 3 shows a part of the top view of the low pass filter apparatus of the present invention. FIG. 1 is connected to FIG. 2 through a connection point 330. A cable television system 10 with printed-circuit-board-layout components of the present invention is applied to a cable television signal supplying apparatus 20. The cable television signal supplying apparatus 20 sends a cable television signal 202 to the cable television system 10. The cable television system 10 receives the cable television signal 202.

The cable television system 10 comprises a low pass filter apparatus 30 and a plurality of multimedia over coax alliance apparatuses 318. The low pass filter apparatus 30 comprises a printed circuit board 302, a plurality of low pass filters 304, at least one grounded metal wall 305, a resistance-type distribution circuit 316 and the connection point 330. Each of the low pass filters 304 comprises a low-pass-side inductor 306, a low-pass-side capacitor 308 and a low-pass-side first inductor 310. The resistance-type distribution circuit 316 comprises a connection resistor 320, a plurality of distribution resistors 324 and a plurality of high pass filters 322. Each of the high pass filters 322 comprises a high-pass-side capacitor 326 and a high-pass-side grounded inductor 328.

The components mentioned above are electrically connected to each other. The low pass filters 304, the low-pass-side inductors 306, the low-pass-side capacitors 308, the low-pass-side first inductors 310, the resistance-type distribution circuit 316, the connection resistor 320, the high pass filters 322, the distribution resistors 324, the high-pass-side capacitors 326 and the high-pass-side grounded inductors 328 are arranged on the printed circuit board 302. The low pass filters 304 are connected to each other in series. The low-pass-side inductors 306 of the low pass filters 304 are connected to each other in series. The at least one grounded metal wall 305 is arranged corresponding to the low pass filters 304. The low-pass-side first inductor 310 is electrically connected to the low-pass-side capacitor 308. The low-pass-side first inductor 310 or the low-pass-side capacitor 308 is connected to ground. Namely, as shown in FIG. 1, firstly the low-pass-side capacitor 308 is connected to the low-pass-side first inductor 310, and then the low-pass-side first inductor 310 is connected to ground; or, firstly the low-pass-side first inductor 310 is connected to the low-pass-side capacitor 308, and then the low-pass-side capacitor 308 is connected to ground. One side of the high-pass-side grounded inductor 328 is electrically connected to the high-pass-side capacitor 326. The other side of the high-pass-side grounded inductor 328 is connected to ground.

At least two of the low-pass-side inductors 306 of the low pass filters 304 are manufactured on the printed circuit board 302 by a printed-circuit-board-layout technology to form at least two low-pass-side printed-circuit-board-layout inductors. At least one of the low-pass-side capacitors 308 of the low pass filters 304 is manufactured on the printed circuit board 302 by the printed-circuit-board-layout technology to form a low-pass-side printed-circuit-board-layout capacitor. At least one of the low-pass-side first inductors 310 of the low pass filters 304 is manufactured on the printed circuit board 302 by the printed-circuit-board-layout technology to form a low-pass-side printed-circuit-board-layout grounded inductor. At least one of the low-pass-side first inductors 310 of the low pass filters 304 is a low-pass-side dip inductor, which is used to adjust electrical characteristics of the whole circuit (namely, the low pass filter apparatus 30). At least one of the high-pass-side capacitors 326 of the high pass filters 322 is manufactured by the printed-circuit-board-layout technology to form a high-pass-side printed-circuit-board-layout capacitor. At least one of the high-pass-side grounded inductors 328 of the high pass filters 322 is manufactured by the printed-circuit-board-layout technology to form a high-pass-side printed-circuit-board-layout grounded inductor.

Each of the multimedia over coax alliance apparatuses 318 sends a multimedia over coax alliance (which is usually abbreviated as MoCA) signal 312 to the resistance-type distribution circuit 316. The low pass filters 304 are configured to filter out the multimedia over coax alliance signal 312. The low pass filter apparatus 30 is configured to filter out a signal having a frequency above 1 GHz. Each of the high pass filters 322 is configured to filter out a low frequency signal. The low frequency signal is, for example but not limited to, the cable television signal 202 sent by the cable television signal supplying apparatus 20.

The at least one grounded metal wall 305 is a part of a metal housing of the low pass filter apparatus 30. The printed circuit board 302 and the low pass filters 304 are arranged in the metal housing. An average distance between at least one of the low-pass-side printed-circuit-board-layout inductors of the low pass filters 304 and the metal housing is within a first distance range, so that the at least one grounded metal wall 305 is configured to block a magnetic interference between the low-pass-side inductors 306 of the low pass filters 304. The first distance range is, for example but not limited to, between 0.1 millimeter and 3 millimeters.

In another embodiment of the present invention, the at least one grounded metal wall 305 is a metal partition plate which is arranged on the printed circuit board 302.

The advantages of the present invention are to reduce the magnetic interference between the inductors, and to save the cost of the inductors and the installation space of the inductors. Moreover, the insertion loss of the present invention is low. The rejection of the present invention is high. Moreover, because the present invention comprises the at least one grounded metal wall 305 and the present invention uses the inductors manufactured by the printed-circuit-board-layout technology, the present invention can reduce the magnetic interference between the inductors. Moreover, compared to dip inductors, using the inductors manufactured by the printed-circuit-board-layout technology can be close to the metal housing with a large area, so that the magnetic interference between the inductors can be reduced. Moreover, because the present invention uses the inductors and the capacitors manufactured by the printed-circuit-board-layout technology, compared to dip inductors and dip capacitors, the present invention can save the cost of the components and the installation space of the components.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A cable television system configured to receive a cable television signal, the cable television system comprising:
   a low pass filter apparatus,
   wherein the low pass filter apparatus comprises:
   a printed circuit board;
   a plurality of low pass filters arranged on the printed circuit board; and
   at least one grounded metal wall arranged corresponding to the low pass filters,
   wherein each of the low pass filters comprises:
   a low-pass-side inductor arranged on the printed circuit board; and
   a low-pass-side capacitor electrically connected to the low-pass-side inductor, and arranged on the printed circuit board,
   wherein at least two of the low-pass-side inductors of the low pass filters are manufactured on the printed circuit board by a printed-circuit-board-layout technology to form at least two low-pass-side printed-circuit-board-layout inductors; the at least one grounded metal wall is configured to block a magnetic interference between the low-pass-side inductors of the low pass filters; the low pass filter apparatus is configured to filter out a signal having a frequency above 1 GHz.

2. The cable television system in claim 1, wherein the at least one grounded metal wall is a part of a metal housing of the low pass filter apparatus; the printed circuit board and the low pass filters are arranged in the metal housing; an average distance between at least one of the low-pass-side printed-circuit-board-layout inductors of the low pass filters and the metal housing is within a first distance range.

3. The cable television system in claim 2, wherein the first distance range is between 0.1 millimeter and 3 millimeters.

4. The cable television system in claim 3, wherein each of the low pass filters further comprises:
   a low-pass-side first inductor electrically connected to the low-pass-side capacitor,
   wherein the low-pass-side first inductor or the low-pass-side capacitor is connected to ground; the low-pass-side first inductor is arranged on the printed circuit board.

5. The cable television system in claim 4, wherein the low pass filters are configured to filter out a multimedia over coax alliance signal.

6. The cable television system in claim 5, wherein the low pass filter apparatus further comprises:
   a resistance-type distribution circuit electrically connected to the low pass filters, and arranged on the printed circuit board,
   wherein the resistance-type distribution circuit comprises:
   a connection resistor electrically connected to the low pass filters, and arranged on the printed circuit board;
   a plurality of distribution resistors electrically connected to the connection resistor, and arranged on the printed circuit board; and
   a plurality of high pass filters electrically connected to the distribution resistors, and arranged on the printed circuit board,
   wherein each of the high pass filters is configured to filter out a low frequency signal;
   wherein each of the high pass filters comprises:
   a high-pass-side capacitor electrically connected to one of the distribution resistors, and arranged on the printed circuit board; and
   a high-pass-side grounded inductor, one side of the high-pass-side grounded inductor electrically connected to the high-pass-side capacitor, the other side of the high-pass-side grounded inductor connected to ground, the high-pass-side grounded inductor arranged on the printed circuit board.

7. The cable television system in claim 6, wherein at least one of the high-pass-side grounded inductors of the high pass filters is manufactured by the printed-circuit-board-layout technology to form a high-pass-side printed-circuit-board-layout grounded inductor.

8. The cable television system in claim 7, wherein at least one of the low-pass-side first inductors of the low pass filters is manufactured on the printed circuit board by the printed-circuit-board-layout technology to form a low-pass-side printed-circuit-board-layout grounded inductor; at least one of the low-pass-side first inductors of the low pass filters is a low-pass-side dip inductor.

9. The cable television system in claim 2, wherein at least one of the low-pass-side capacitors of the low pass filters is manufactured on the printed circuit board by the printed-circuit-board-layout technology to form a low-pass-side printed-circuit-board-layout capacitor.

10. The cable television system in claim 1, wherein the at least one grounded metal wall is arranged on the printed circuit board.

* * * * *